(12) United States Patent
Farsiabi et al.

(10) Patent No.: US 12,170,530 B1
(45) Date of Patent: Dec. 17, 2024

(54) FLEXIBLE-RATE POLAR DECODER-BASED COMMUNICATION SYSTEMS AND METHODS

(71) Applicant: HUAWEI TECHNOLOGIES CO., LTD., Guangdong (CN)

(72) Inventors: Ali Farsiabi, Kanata (CA); Hamid Ebrahimzad, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/353,423

(22) Filed: Jul. 17, 2023

(51) Int. Cl.
*H03M 13/00* (2006.01)
*H03M 13/13* (2006.01)

(52) U.S. Cl.
CPC ....... *H03M 13/13* (2013.01); *H03M 13/6572* (2013.01)

(58) Field of Classification Search
None
See application file for complete search history.

(56) References Cited

U.S. PATENT DOCUMENTS

| | | | | |
|---|---|---|---|---|
| 10,193,578 | B2 * | 1/2019 | Gross | H03M 13/09 |
| 2016/0013810 | A1 * | 1/2016 | Gross | H03M 13/617 |
| | | | | 714/776 |
| 2017/0047947 | A1 * | 2/2017 | Hong | H03M 13/2906 |
| 2017/0230059 | A1 * | 8/2017 | Giard | H03M 13/13 |
| 2018/0248655 | A1 * | 8/2018 | Belfiore | H03M 13/13 |
| 2018/0323905 | A1 * | 11/2018 | Shelby | H04L 1/0058 |
| 2020/0366317 | A1 * | 11/2020 | Myung | H04L 1/005 |
| 2020/0412385 | A1 * | 12/2020 | Arikan | H04L 1/0041 |
| 2021/0105089 | A1 * | 4/2021 | Chen | H04L 1/0057 |

OTHER PUBLICATIONS

Hashemi et al., "Rate-Flexible Fast Polar Decoders", IEEE Transactions on Signal Processing, vol. 67, No. 22, Nov. 15, 2019, pp. 5689-5701.
Arikan, "Channel polarization: A method for constructing capacity achieving codes for symmetric binary-input memoryless channels", IEEE Trans. Inf. Theory, vol. 55, pp. 3051-3073, Jul. 2009.

(Continued)

*Primary Examiner* — Mujtaba M Chaudry
(74) *Attorney, Agent, or Firm* — BCF LLP

(57) ABSTRACT

A method for decoding polar codes based encoded data comprises receiving the polar codes based encoded data, determining a rate at which the data is encoded, based on the determined rate, selecting suitable implemented super nodes in a flexible-rate polar decoder, and decoding the polar codes based encoded data. A flexible-rate polar decoder is created by receiving polar codes corresponding to a set of desired overheads, generating, for each overhead, a binary tree using fast successive cancellation decoding, generating a unified binary tree by determining locations of super nodes within each binary tree, representing the determined locations having same node index among different binary trees as super locations in the unified binary tree, each super location including more than one super node, and implementing the unified binary tree on an application specific hardware structure to create the flexible-rate polar decoder.

11 Claims, 11 Drawing Sheets

(56) References Cited

OTHER PUBLICATIONS

Sarkis et al., "Fast polar decoders: Algorithm and implementation", IEEE J. Sel. Areas Commun., vol. 32, No. 5, pp. 946-957, May 2014.

Hanif et al., "Fast successive-cancellation decoding of polar codes: Identification and decoding of new nodes", IEEE Commun. Lett., vol. 21, No. 11, pp. 2360-2363, Nov. 2017.

Hashemi et al., "Simplified successive-cancellation list decoding of polar codes", in IEEE Int. Symp. on Inform. Theory, Jul. 2016, pp. 815-819.

Almdar-Yazdi et al., "A simplified successive cancellation decoder for polar codes", IEEE Comm. Letters, vol. 15, No. 12, Dec. 2011, pp. 1378-1380.

Zheng et al., "Threshold-Based Fast Successive-Cancellation Decoding of Polar Codes", IEEE Transactions on Communications, vol. 69, No. 6, pp. 3541-3555, Jun. 2021.

Yuan et al., "Low-Latency Successive-Cancellation List Decoders for Polar Codes With Multibit Decision", IEEE Transactions on Very Large Scale Integration (VLSI) Systems, vol. 23, No. 10, pp. 2268-2280, Oct. 2015.

Hanif et al., "Fast Encoding and Decoding of Flexible-Rate and Flexible-Length Polar Codes", arXiv1704.00651, 2017.

\* cited by examiner

FLEXIBLE-RATE POLAR DECODER-BASED COMMUNICATION SYSTEMS AND METHODS

CROSS-REFERENCE TO RELATED APPLICATIONS

This is the first application filed for the instantly disclosed technology.

TECHNICAL FIELD

The present disclosure generally relates to digital communications and, in particular, to flexible-rate polar decoder-based communication systems and methods.

BACKGROUND

In modern high-throughput optical communication systems, forward error correction (FEC) is a crucial technique for protecting the data against the channel noise and inherent system impairments. Typically, polar codes have been used to achieve the symmetric capacity of binary-input, discrete memoryless channels with low-complexity encoding and decoding. The polar codes have an explicit construction method with capacity-achieving properties that have been explored.

However, a primary concern regarding such polar codes is the high-decoding latency of the successive cancellation (SC) based decoding algorithms. In particular, the sequential nature of the SC decoder significantly reduces the achievable throughput.

Lately, to improve the decoding latency, techniques have been proposed for fast SC decoding algorithms in which many of the computations have been parallelized. These techniques are mainly based on the identification of certain types of special nodes in the binary tree of the polar codes whose decoding can be performed in parallel rather than following the serial SC schedule.

Even with the fast SC decoding algorithms, conventional polar codes still suffer from latency issues. With this said, there is an interest in improving the latency of communication systems.

SUMMARY

The embodiments of the present disclosure have been developed based on developers' appreciation of the limitations associated with the prior art, namely, the high-decoding latency and the reduced achievable throughput.

Developers of the present technology have devised flexible-rate polar decoder-based communication systems and methods.

In accordance with a first broad aspect of the present disclosure, there is provided a method for creating a flexible-rate polar decoder for a communication system, the method comprising: receiving polar codes corresponding to a set of desired overheads; for each overhead of the set of desired overheads, generating a binary tree using fast successive cancellation decoding; generating a unified binary tree from the binary trees associated with the set of overheads, the generating of the unified binary tree comprising: within each binary tree, determining locations of super nodes; representing the determined locations having same node index among different binary trees as super locations in the unified binary tree, in which each super location includes more than one super node; and; implementing the unified binary tree on an application specific hardware structure to create the flexible-rate polar decoder.

In accordance with any embodiments of the present disclosure, the super nodes include one or more of Rate-0, Rate-1, repetition (REP), single parity check (SPC), TypeI, TypeII, TypeIII, TypeIV, TypeV super nodes.

In accordance with any embodiments of the present disclosure, the application specific hardware corresponding to the flexible-rate polar decoder includes: a first portion that includes at least some implemented nodes of the unified binary tree that are common to all of the binary trees, the first portion is shared among polar codes having different rates; and a second portion that includes: implemented super nodes at the super locations, and one or more switches configured to select suitable implemented super nodes depending on a rate of the polar codes.

In accordance with any embodiments of the present disclosure, the second portion is separated from the first portions by the one or more switches.

In accordance with any embodiments of the present disclosure, the method further comprises integrating the flexible-rate polar decoder in a receiver associated with the communication system.

In accordance with a second broad aspect of the present disclosure, there is provided a receiver in a communication system, comprising: a flexible-rate polar decoder comprising: a first portion including at least some implemented nodes of a unified binary tree that are common to all binary trees associated with the unified binary tree, the first portion is shared among polar codes having different rates; and a second portion including: implemented super nodes associated with the binary trees located at super locations, the super locations representing the locations having same node index among different binary trees; and one or more switches configured to select suitable implemented super nodes depending on a rate of the polar codes.

In accordance with any embodiments of the present disclosure, the second portion is separated from the first portions by the one or more switches.

In accordance with any embodiments of the present disclosure, the unified binary tree is previously generated and includes the binary trees corresponding to polar codes related to a set of desired overheads.

In accordance with any embodiments of the present disclosure, the super locations include more than one super node.

In accordance with any embodiments of the present disclosure, the receiver further comprises a controller configured to: receive polar codes based encoded data; determine the rate at which the data is encoded; and based on the determined rate, provide control signals to the one or more switches to select suitable implemented super nodes.

In accordance with any embodiments of the present disclosure, the super nodes include one or more of Rate-0, Rate-1, repetition (REP), single parity check (SPC), TypeI, TypeII, TypeIII, TypeIV, TypeV super nodes.

In accordance with a third broad aspect of the present disclosure, there is provided a method for decoding polar codes based encoded data, the method comprising: receiving the polar codes based encoded data; determining a rate at which the data is encoded; based on the determined rate, selecting suitable implemented super nodes in a flexible-rate polar decoder; and decoding the polar codes based encoded data.

In accordance with any embodiments of the present disclosure, the selecting the suitable implemented super nodes includes providing control signals to one or more switches included the flexible-rate polar decoder.

In accordance with any embodiments of the present disclosure, the super nodes include one or more of Rate-0, Rate-1, repetition (REP), single parity check (SPC), TypeI, TypeII, TypeIII, TypeIV, TypeV super nodes.

BRIEF DESCRIPTION OF THE FIGURES

Further features and advantages of the present disclosure will become apparent from the following detailed description, taken in combination with the appended drawings, in which.

Figure 1:
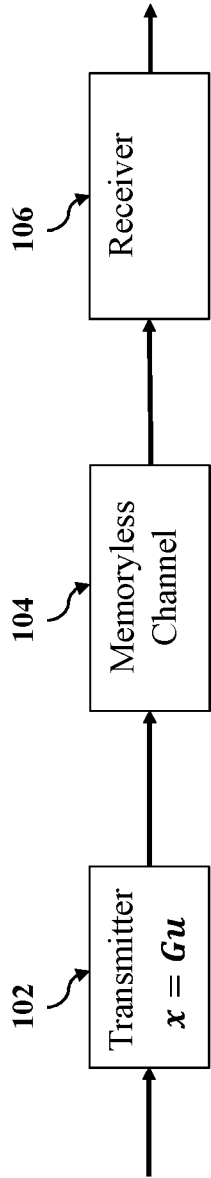
FIG. 1 (Prior Art) illustrates a communication system for encoding and decoding of a polar code with a length of N=8 and a length of information bits K=4.

It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims.

DETAILED DESCRIPTION

The instant disclosure is directed to address at least some of the deficiencies of the current technology. In particular, the instant disclosure describes flexible-rate polar decoder—based communication systems and methods.

Unless otherwise defined or indicated by context, all technical and scientific terms used herein have the same meaning as commonly understood by one of ordinary skill in the art to which the described embodiments appertain to.

In the context of the present specification, unless provided expressly otherwise, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first processor" and "third processor" is not intended to imply any particular order, type, chronology, hierarchy or ranking (for example) of/between the processor, nor is their use (by itself) intended to imply that any "second processor" must necessarily exist in any given situation. Further, as is discussed herein in other contexts, reference to a "first" element and a "second" element does not preclude the two elements from being the same actual real-world element. Thus, for example, in some instances, a "first" processor and a "second" processor may be the same software and/or hardware, in other cases they may be different software and/or hardware.

It will be understood that when an element is referred to as being "connected" or "coupled" to another element, it can be directly or indirectly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In the context of the present specification, when an element is referred to as being "associated with" another element, in certain embodiments, the two elements can be directly or indirectly linked, related, connected, coupled, the second element employs the first element, or the like without limiting the scope of present disclosure.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor" or a "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

In the context of the present disclosure, the expression "data" includes data of any nature or kind whatsoever capable of being stored in a database. Thus, data includes, but is not limited to, audiovisual works (images, movies, sound records, presentations etc.), data (location data, numerical data, etc.), text (opinions, comments, questions, messages, etc.), documents, spreadsheets, etc.

Software modules, modules, or units which are implied to be software, may be represented herein as any combination of flowchart elements or other elements indicating performance of process steps and/or textual description. Such modules may be executed by hardware that is expressly or implicitly shown.

With these fundamentals in place, the instant disclosure is directed to address at least some of the deficiencies of the current technology. In particular, the instant disclosure describes flexible-rate polar decoder-based communication systems and methods.

FIG. 1 (Prior Art) illustrates a communication system 100 for encoding and decoding of a polar code with a length of N=8 and a length of information channel K=4. As shown, the communication system 100 includes a transmitter 102, and a receiver 106. The transmitter 102 may include a binary polar encoder. The encoder uses a binary polar code P(N, K) of length $N=2^n$ and length of information channel K maps an input vector $u=\{u_0, u_1, \ldots, u_{N-1}\}$ to the output vector $x=\{x_0, x_1, \ldots, x_{N-1}\}$ such that $$x = uG_N \quad (1)$$

The matrix $G_N = B_N F_2^{\otimes n}$ is a generator matrix where $B_N$ is a bit-reversal permutation matrix and $F_2^{\otimes n}$ is the nth Tensor power of $F_2$ defined as $$F_2^{\otimes n} = \begin{bmatrix} F_2^{\otimes n-1} & 0 \\ F_2^{\otimes n-1} & F_2^{\otimes n-1} \end{bmatrix} \quad (2)$$

The symbol 0 is used to denote an all zero sub-matrix and $F_2$ is defined as $$F_2 = \begin{bmatrix} 1 & 0 \\ 1 & 1 \end{bmatrix} \quad (3)$$

The matrix $F_2^{\otimes n}$ on synthesizes N polarized channels from N independent copies of a given channel. Amongst different polarized channels, the K most reliable channels are used to carry the information. In other words, the input vector $u=\{u_0, u_1, \ldots, u_{N-1}\}$ consists of K information bits and N-K fixed bits referred to as frozen bits that are known to the receiver. The index set of the K information bits corresponding to the most reliable bit channels and N-K frozen bits corresponding to the least reliable bit channels are denoted by $A$ and $A^c$, respectively. To distinguish between the frozen bits and information bits, a binary vector $d=(d_0, d_1, \ldots, d_{N-1})$ is defined such that:

$$d_k = \begin{cases} 0, k \in A^c \\ 1, k \in A \end{cases} \quad (4)$$

The reliability order of different polarized channels can be obtained based on various techniques such as density evolution (DE), Tal and Vardy method, Gaussian approximation (GA) etc.

The transmitter 102 transmits the output vector $x=\{x_0, x_1, \ldots, x_{N-1}\}$ over communication channel 104. The output vector $x=\{x_0, x_1, \ldots, x_{N-1}\}$ may be affected by noise. The receiver 106 receives the noisy codewords from the communication channel 104, the receiver 106 computes and provides log likelihood ratio (LLR) vector $y=\{y_0, y_1, \ldots, y_{N-1}\}$, of the received codewords to a polar-code decoder. The decoder, then, estimates the input and output vector of encoder, denoted by $\hat{u}$ and $\hat{x}$, respectively.

Figure 2:
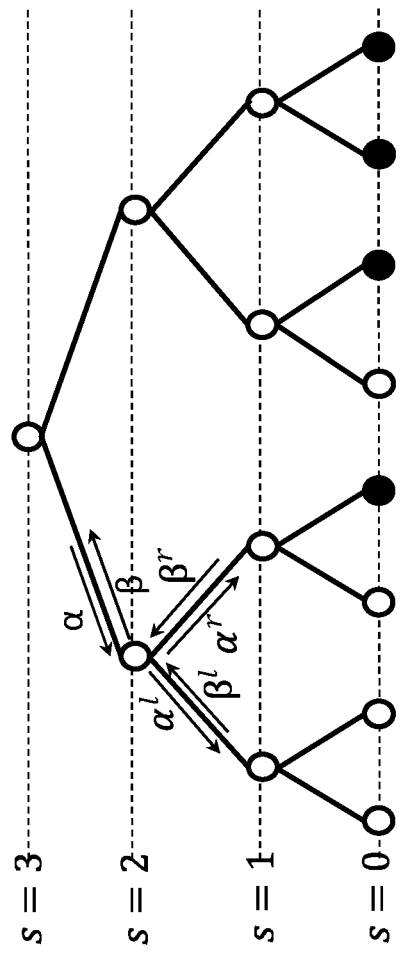
FIG. 2 (Prior Art) illustrates a binary tree representation of the polar code P(8,4)

Relatedly, FIG. 2 (Prior Art) illustrates a binary tree representation 200 of the polar code P(8,4). Typically, the polar-code decoder relies on successive cancelation (SC) decoding. The SC decoding may basically be viewed as the exchange of information between the nodes in the binary tree 200. In particular, each node receives a soft information vector denoted by a with $2^s$ elements. The vector $\alpha$ of the root node at the top of the tree 200 is the channel LLR vector, i.e., $y=\{y_0, y_1, \ldots, y_{N-1}\}$, while a for other nodes is received from their parent nodes. With exception of the leaf nodes at the bottom of the tree 200, using the soft information vector α, each node computes the information toward its left child as:

$$\alpha_i^l = \text{sign}(\alpha_{2i})\text{sign}(\alpha_{2i+1})\min(|\alpha_{2i}|, |\alpha_{2i+1}|) \quad (5)$$

Where $\alpha_i^l$ is the ith $(0 \leq i \leq 2^{s-1}-1)$ elements of the information vector $\alpha^l$ toward the left child node. The information toward the right child node cannot be calculated unless a node receives the binary vector $\beta^l$ with entries $\beta_i^l$ from its left child node. The information toward the right-child node is given by:

$$\alpha_i^r = \alpha_{2i+1} + (1 - 2\beta_i^l)\alpha_{2i} \quad (6)$$

Where $\alpha_i^r$ denotes the ith $(0 \leq i \leq 2^{s-1}-1)$ elements of the information vector toward the right child node. Finally, after receiving the binary vector $\beta^r$ from the right-child node, the binary vector $\beta$ with size $2^s$ is sent toward the parent node. This vector is computed as:

$$\beta = \{\beta^l \otimes \beta^r \beta^r\} \quad (7)$$

In the above equation, $\beta^l \otimes \beta_r$ represents an elementwise modulo-2 addition of the vectors $\beta^l$ and $\beta^r$.

At each leaf node k, a hard decision is made on the received soft LLR from the parent node to calculate $\hat{u}_k$. Also, the binary vector β calculated at the root node is the same as the estimated codeword $\hat{x}$.

The error-correction performance of SC when applied to polar codes with short to moderate length can be improved by the use of list-based decoding. Successive cancellation list (SCL) algorithm estimates a bit considering both its possible values 0 and 1. At every estimation, the number of codeword candidates (paths) doubles. In order to limit the increase in the complexity of this algorithm, only a set of L codeword candidates is memorized at all times. Thus, after every estimation, half of the paths are discarded. To this purpose, a path metric (PM) is associated to each path and updated at every new estimation. The PM can be considered a cost function, and the L paths with the lowest PMs are allowed to survive. In the LLR-based SCL, the path metric can be obtained as $$PML_{i_l} = \begin{cases} PML_{i-1_l} + |\alpha_{i_l}| & \text{if } \hat{u}_{i_l} \neq \frac{1}{2}(1 - \text{sgn}(\alpha_{i_l})) \\ PML_{i-1_l} & \text{Otherwise} \end{cases} \quad (8)$$

Where the initial path metric is $PML_{-1_l}=0$. The symbol l is the path index and $\hat{u}_{i_l}$ is the estimate of bit i at path l. The above metric basically means whenever a decision is against the sign of a bit LLR, the corresponding path is penalized by the absolute value of that LLR and otherwise, the penalty would be zero.

Figure 3:
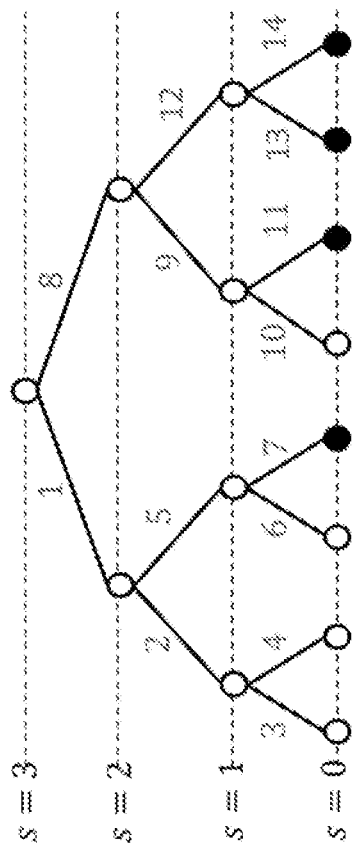
FIG. 3 (Prior Art) illustrates another binary tree representation of the polar code P(8,4)

Based on the description of the SC decoding discussed above, in order to decode the polar code, the entire binary tree from top to bottom and left to right may be required to be traversed. The sequential nature of SC decoding results in a high-decoding latency and is a challenging problem of the polar codes. For example, in FIG. 3 (Prior Art), the order based on which the input vector $u=\{u_0, u_1, \ldots, u_{N-1}\}$ is computed in SC decoding of a polar code P(8, 4) is shown with the numbers next to the edges of the binary tree 300.

Assuming the bit operations may be performed instantly, the SC decoding requires 2N−2=14 time steps to decode the codeword.

Various conventional techniques have been proposed to improve a decoding speed of the decoder. Such as, for example, by implementing decoders that do not traverse the whole tree and instead of bit by bit decoding, output multiple bits at the same time. Based on this approach, various fast parallel decoders for different type of nodes in the binary tree of the polar codes have been proposed. Such nodes may be referred to as super nodes or special nodes, alternatively.

One of the conventional techniques proposes to use $2^p$ decoders for nodes of size p bits, for example p=2, 4, 8, or the like. In this approach, all the possible combination of frozen bits and information bits are considered for the sub-codes of size p. The issue with such conventional techniques is in terms of hardware complexity considering $2^p$ decoder per nodes of size p.

Another conventional technique proposes reducing the number of required decoders for leaf nodes of sizes 8 and 16. In such techniques to cover all the possible overheads (OHs), it is only required to use 9 decoders for each leaf node of size 8 bits or 21 decoders for each leaf node of size 16. While this method reduces the complexity compared to the previous conventional techniques, this method is still complex to implement for cases where the required OHs are limited. In many cases, the embodiments are directed to supporting a limited number of OHs not all the possible OHs.

Yet another conventional technique proposes to identify the type of special nodes on-the-fly and for all OHs. An achievable throughput with this conventional technique is far from the requirements in high-throughput applications such as optical communications where deeply pipelined decoders such as unrolled decoders are of practical interest.

Even though, identifying the special nodes (super nodes) may significantly reduce the decoding latency, one of the predominant issues is that the special nodes are defined after the code design stage. In other words, changing the code rates may result in different sets of special nodes requiring different hardware at various stages of binary tree.

It is to be noted that multi-rate decoders may be required in many optical applications in which the hardware chips are designed for various spectral efficiency/OHs. With this said, various embodiments of the present disclosure are directed towards designing and implementing a flexible-rate polar decoder that may result in minimal latency and hardware resources for polar decoders that support a predefined set of OHs. It is contemplated that an OH may be defined in the terms of code rate R as (1/R−1)*100, and the code rate R is defined as a ratio the length of information channel K and the length of polar code N.

The flexible-rate polar decoder, in accordance with various embodiments of the present disclosure may be based on the required OHs instead of all possible OHs. To design the flexible-rate polar decoder, the required polar codes, information channels, and the corresponding OHs may be known in advance.

In various embodiments, the flexible-rate polar decoder may be designed based on a unified binary tree. The unified binary tree may be designed by identifying special nodes in different binary trees corresponding to different OHs. The super nodes may include, for example Rate-0, Rate-1, repetition (REP), single parity check (SPC), TypeI, TypeII, TypeIII, TypeIV, Type V, or the like.

Figure 4:
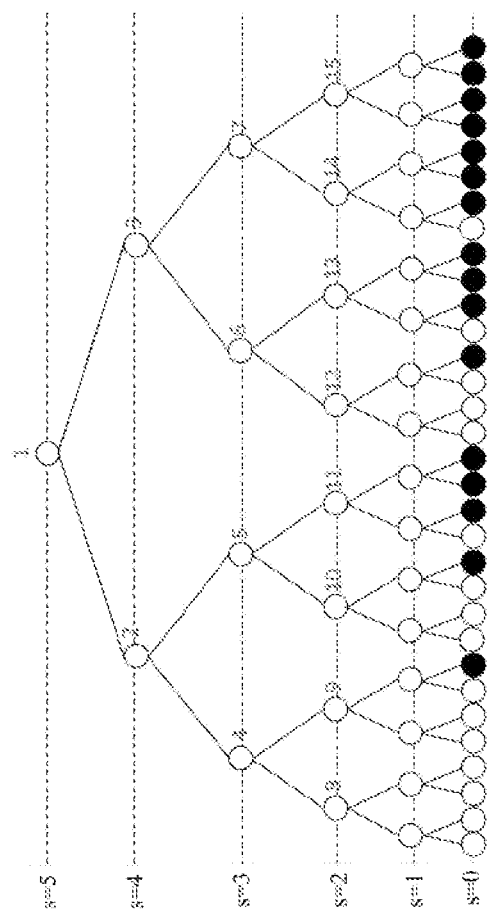
FIG. 4 illustrates another binary tree representation of the polar code P(32, 16), in accordance with various embodiments of the present disclosure.

FIG. 4 illustrates another binary tree representation 400 of the polar code P(32, 16), in accordance with various embodiments of the present disclosure. The binary tree representation 400 may be used to illustrate various examples of super nodes. A binary vector $d=(d_0, d_1, \ldots, d_{N_v-1})$ represents the location of information and frozen bits in different type of special nodes. The symbol $N_v=2^s$ denotes the size of a super node.

For a Rate-O super node, the binary vector $d=(0,0,\ldots,0)$. In the Rate-0 super node, all the bits at the corresponding leaf nodes are frozen bits. For example, in FIG. 4, node 8 is a Rate-O super node of size 4, as all the 4 corresponding leaf nodes are frozen bits (white circles).

For Rate-1 super node, the binary vector $d=(1,1,\ldots,1)$. In the Rate-1 super node, all the bits at the corresponding leaf nodes are information bits. For example, in FIG. 4, node 15 is a Rate-1 super node of size 4, as all the 4 corresponding leaf nodes are information bits (black circles).

For REP super node, the binary vector $d=(0,0,\ldots,0,1)$. In the REP super node, all bits at the corresponding leaf nodes are frozen bits except the rightmost bit position which is a message bit. For example, in FIG. 4, node 4 is a REP super node of size 8, As except the rightmost bit, all the other corresponding leaf nodes are frozen bits. In FIG. 4, nodes number 10 and 12 are also REP super nodes of size 4.

For SPC super node, the binary vector $d=(0,1,\ldots,1)$. In the SPC super node, all bits at the corresponding leaf nodes are information bits except the leftmost bit position which is a frozen bit. For example, in FIG. 4, node 7 is an SPC super node of size 8, because, except the leftmost bit, all the other corresponding leaf nodes are information bits. In FIG. 4, nodes number 11 and 13 are also SPC super nodes of size 4.

Figure 5:
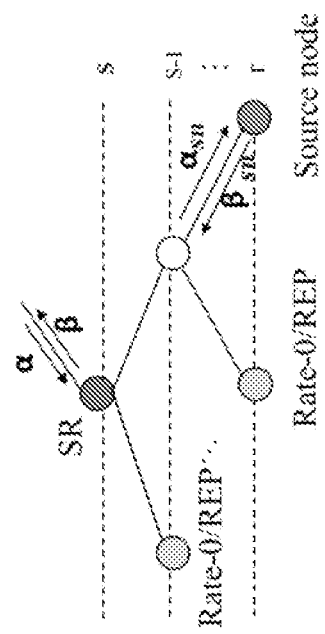
FIG. 5 illustrates a structure of Sequence Repetition (SR) node, in accordance with various embodiments of the present disclosure.

A structure of a Sequence Repetition (SR) super node 500 is illustrated in FIG. 5, in accordance with various embodiments of the present disclosure. In the SR super node 500 at level s of the binary tree with size $N_v=2_s$, all the left descendants at different levels are either Rate-0 or REP nodes while the rightmost descendent in a level r, referred to as a source node, may be a node of any type with size $2^r$. In FIG. 4, node 2 is an SR super node with size 16 where its source node is an SPC super node with size 4.

For Type-I super node, the binary vector $d=(0,0,\ldots,0,1,1)$. In the Type-I super node, all bits at the corresponding leaf nodes are frozen bits except the two rightmost bit positions which are message bits.

For Type-II super node, the binary vector $d=(0,0,\ldots,0,1,1,1)$ for $N_v>4$. In the Type-II super node, the node size is greater than or equal to 8 and all bits at the corresponding leaf nodes are frozen bits except the three rightmost bit positions which are message bits.

For Type-III super node the binary vector $d=(0,0,1,\ldots,1,1)$. In the Type-III super node, all bits at the corresponding leaf nodes are message bits except the two leftmost bit positions which are frozen bits.

For Type-IV super node the binary vector $d=(0,0,0,1,\ldots,1,1)$. In the Type-IV super node, all bits at the corresponding leaf nodes are message bits except the three leftmost bit positions which are frozen bits.

For Type-V super node the binary vector $d=(0,\ldots 0,0,0,1,0,1,1)$. The Type-V super node may be considered as a subset of SR super nodes.

Figure 6:
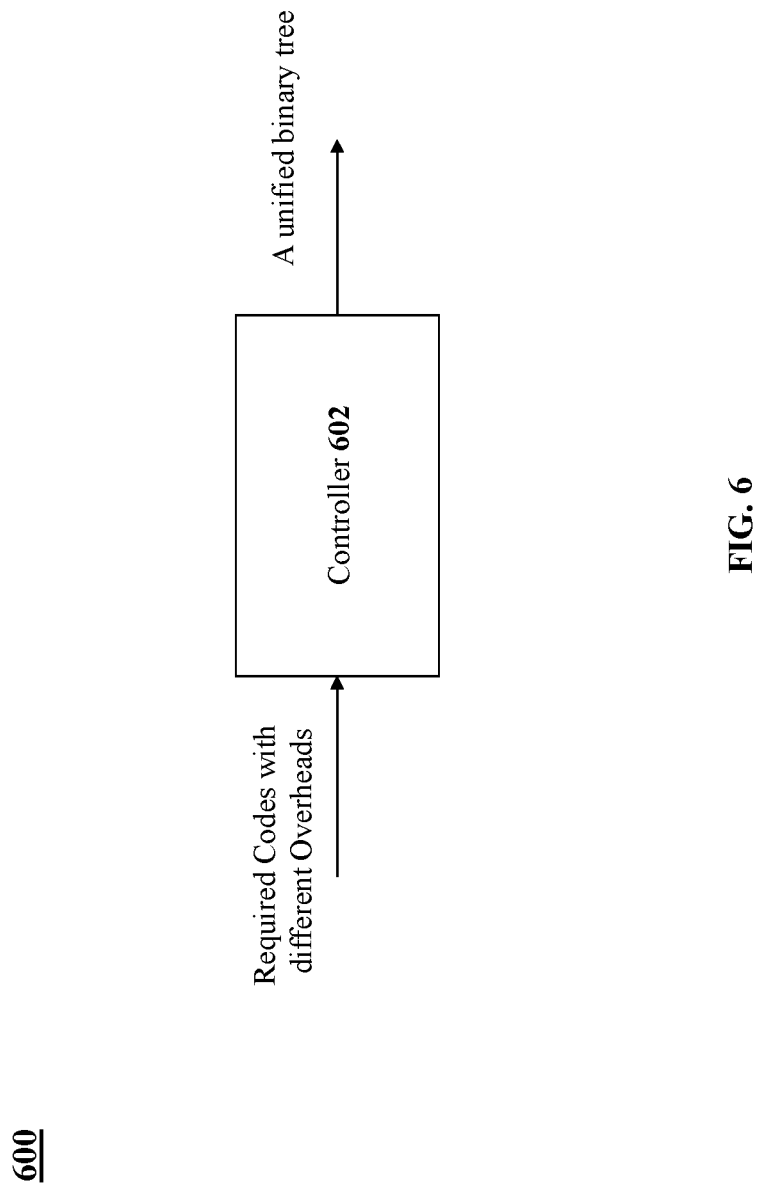
FIG. 6 illustrates a high-level functional block diagram of a system for generating a unified binary tree, in accordance with various embodiments of the present disclosure.

FIG. 6 illustrates a high-level functional block diagram of a system 600 for generating a unified binary tree, in accordance with various embodiments of the present disclosure. As shown, the system 600 may include a controller 602. The controller 602 may be configured to receive the required polar codes along with different OHs. The controller 602 may generate SC decoding based binary trees for the required OHs. From the binary trees of the SC decoding, the controller 602 may generate fast SC decoding based binary trees. The binary trees of the fast SC decoding may include different super nodes, the controller 602 may determine locations of the super nodes in different binary trees. Further, the controller 602 may identify the super nodes located the same node index in different binary trees. During the special node identification, the controller 602 only consider a node in the binary trees as special node if this node for all the required OHs be a special node. Based on the super nodes located at same node index, the controller 602 may generate a unified binary tree. In the unified binary tree, the node index of the special nodes in various code rates may be the same, however, a type of the node may be different The unified binary tree may be used to decode the polar codes with different OHs and code rates. One of the benefits of using a unified binary tree for decoding the polar codes is sharing the hardware resources related to the binary tree of all the OHs. Merely the portion of the hardware that is different is where the special nodes are decoded. Once a unified binary tree is generated, the unified binary tree may be used for creating the flexible-rate polar decoder.

Figure 7:
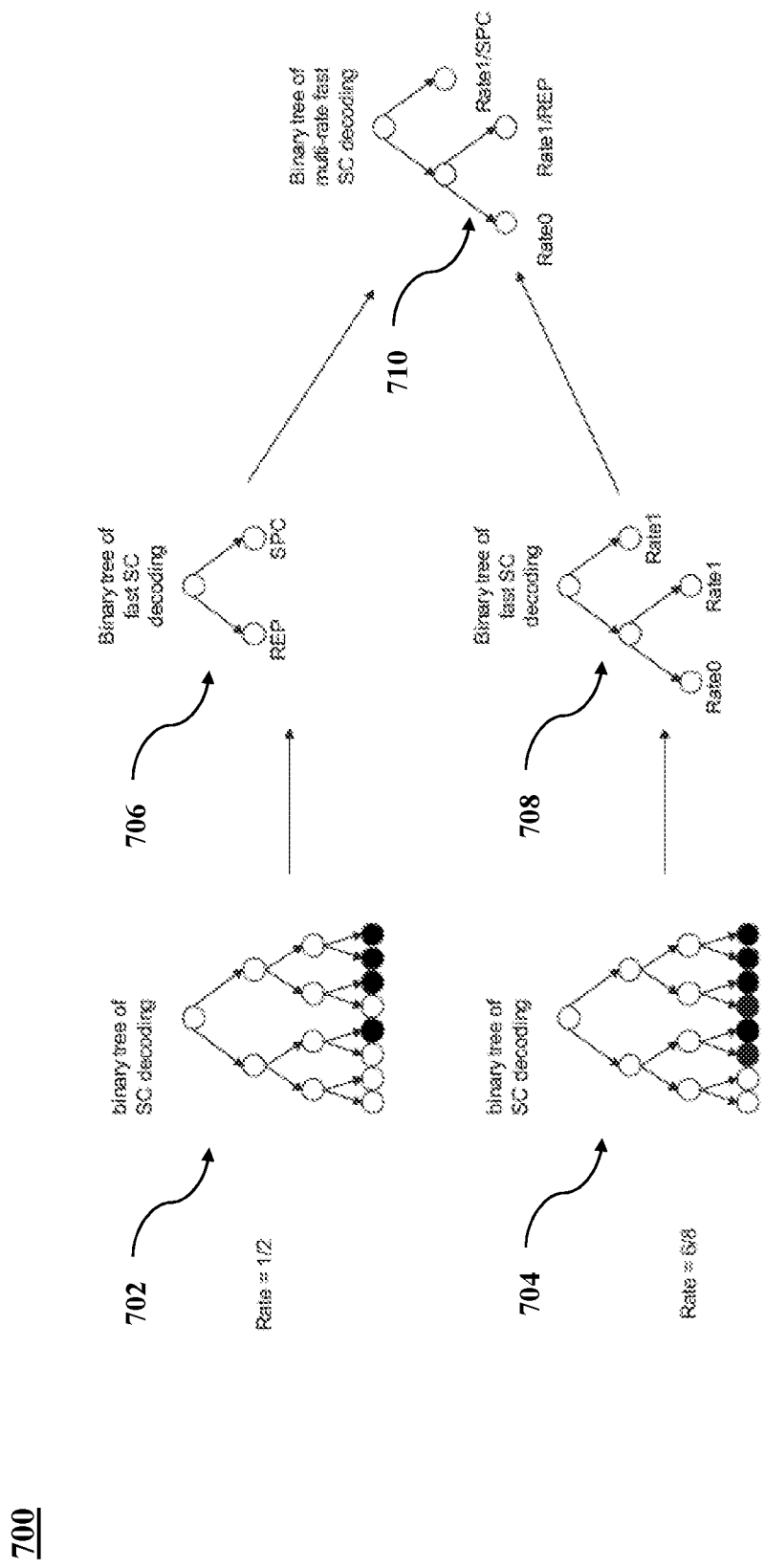
FIG. 7 illustrates an example of generating a unified binary tree for two different OHs, in accordance with various embodiments of the present disclosure.

FIG. 7 illustrates an example 700 of generating a unified binary tree for two different OHs, in accordance with various embodiments of the present disclosure. Initially, the controller 602 may receive two OHs, the first one with 100% OH and the second one with 33.33% OH. The controller 602 may generate a binary tree 702 and a binary tree 704 SC decoding. Using the binary trees 702 and 704, the controller 602 may generate fast SC decoding based binary trees 706 and 708. The binary tree 706 may be generated from the binary tree 702 and the binary tree 708 may be generated from the binary tree 704.

The controller 602 may determine the locations of the super nodes in the binary trees 706 and 708. For the node index that has super nodes at the same location in both the binary trees 706 and 708 irrespective of the type of the super nodes, the node index may be referred to as super location. A super location may be referred to as same location (or node index) in the binary trees 706 and 708 that has a super node irrespective of the type of super node. For example, a right most child node in the binary tree 706 and a right most child node in the binary tree 708 have special nodes SPC and Rate I respectively. In the unified binary tree, the location of the right most child node may be treated as a special location where the node may be a super node SPC or Rate I. Further, it may be observed that all the branches in the unified binary tree 710 are common for both OHs and only at the leaf nodes some of the special nodes are different.

In another practical example, the flexible-rate polar decoder may support OHs 15%, 21% and 28% with code length 16*k*. For each individual OH, the distribution of special nodes may be illustrated as follows:

For C1(16384, 12800): 274 total number of super-nodes with R0: 15, R1: 40, REP: 46, SPC: 76, T1: 12, T2: 9, T3: 12, T4: 11, T5: 53;

C2(16384, 13500): 229 total number of super-nodes with R0: 10, R1: 41, REP: 46, SPC: 56, T1: 7, T2: 12, T3: 12, T4: 8, T5: 37; and C3(16384, 14245): 219 total number of super-nodes and R0: 5, R1: 36, REP: 57, SPC: 55, T1: 3, T2: 11, T3: 6, T4: 8, T5: 38.

Based on the determined super nodes, the controller 602 may generate a unified binary tree with a total of 436 super nodes. For each individual OH, the distribution of the overlapped special nodes may be illustrated as in Table 1 as follows:

TABLE 1

| 28% | 21% | 15% |
|---|---|---|
| R0-177 | R0-103, REP-46, T1-7, T2-11, T5-10 | R0-5, REP-57, SPC-49, T1-3, T2-11, T3-6, T4-8, T5-38 |
| R1-40 | R1-40 | R1-40 |
| REP-46 | SPC-1, T2-1, T3-10, T4-8, T5-26 | R1-40, SPC-6 |
| SPC-76 | R1-76 | R1-76 |
| T-12 | SPC-10, T3-1, T5-1 | R1-12 |
| T2-9 | SPC-9 | R1-9 |
| T3-12 | R1-12 | R1-12 |
| T4-11 | R1-10, SPC-1 | R1-11 |
| T5-53 | R1-17, SPC-35, T3-1 | R1-53 |

In Table.1, the overlaps among different super nodes in the 3 different OHs is shown. For example, in the first code, there exist 76 SPC nodes that are overlapped with 76 R1 nodes that belong to the other 2 OHs and so on. The unified binary tree having 436 nodes may require at least 1 decoder per super node and a maximum of 3 decoders per super node. The number of decoders required per super node is much less as compared to the conventional techniques. Additionally, a total number of branches in the unified binary tree may be proportional to latency and the required memory at different stages of decoding. In the above example, a total number of branches may be equal to 870. However, for a similar requirement, the conventional technique requires 4094 branches.

One of the advantages of various embodiments of the present disclosure is hardware sharing. In addition to the branches of the unified binary tree that are common among different OHs, the hardware of the super nodes can also be shared to some extent. For example, since R0 nodes may not need decoding, simply the nodes corresponding to 21% or 15% codes can be switched off for decoding 28% code and their output may be set to all zero. Moreover, decoding the SPC nodes and R1 nodes is quite similar. In both cases, first a hard decision may be made on input LLRs. In R1 decoder, the hard decision may be considered as the output while in SPC nodes, the parity is checked. If the parity check is satisfied, the hard decision of the previous stage is considered as output. Otherwise, the bit with minimum reliability may be flipped and then the bit sequence is considered as output.

Figure 8:
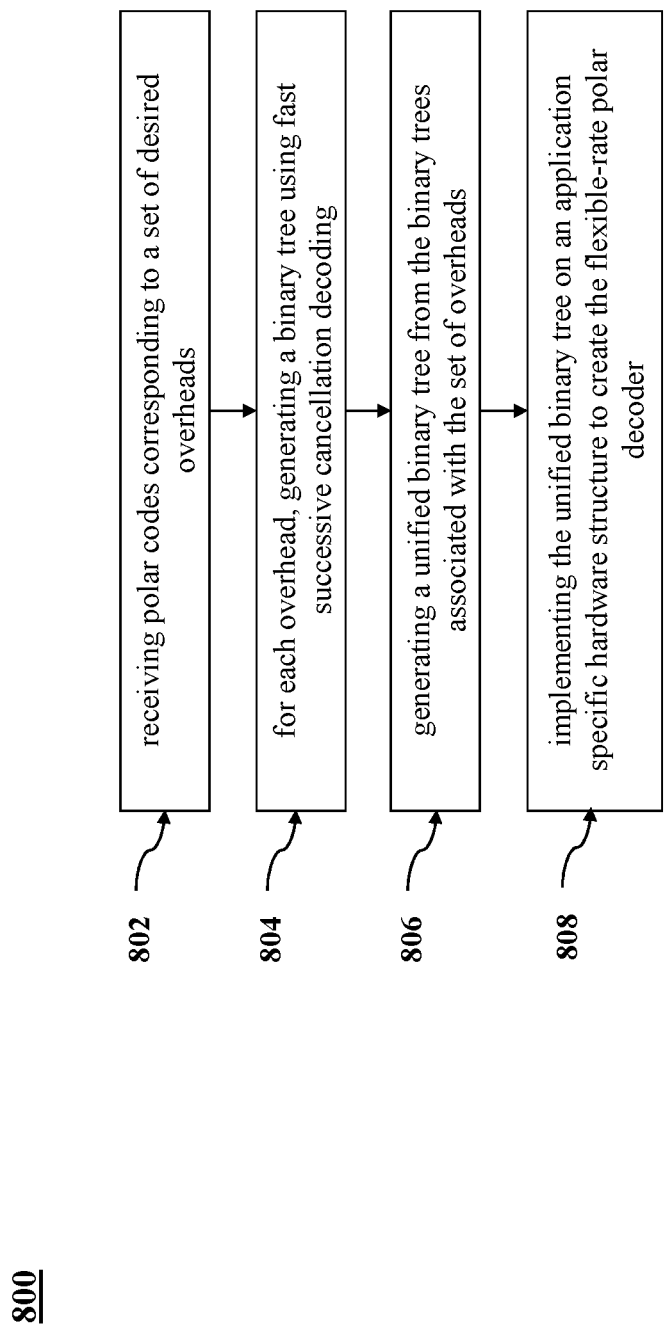
FIG. 8 illustrates a flowchart of a process for creating a flexible-rate polar decoder for a communication system, in accordance with various non-limiting embodiments of the present disclosure.

FIG. 8 illustrates a flowchart of a process 800 for creating a flexible-rate polar decoder for a communication system, in accordance with various non-limiting embodiments of the present disclosure. As shown, the process 800 commences at step 802 where the controller 602 receives polar codes corresponding to a set of desired OHs. The set of desired OHs may be referred to as OHs that the flexible-rate polar decoder may be intended to process. In one non-limiting example, the set of desired OHs may include 15%, 21%, and 28%.

The process 800 advances to step 804 where for each OH in the set of OHs, the controller 602 generates a binary tree using successive cancellation decoding.

The process 800 proceeds to step 806, where the controller 602 generates a unified binary tree from the binary trees associated with the sets of OHs. In certain embodiments, the controller 602 may generate the unified binary tree by determining locations of super nodes within each binary tree. The locations having same node index among different binary trees are represented as super locations in the unified binary tree. Each super location including more than one super node.

Finally, at step 808, the unified binary tree is implemented on an application specific hardware structure to create the flexible-rate polar decoder.

Figure 9:
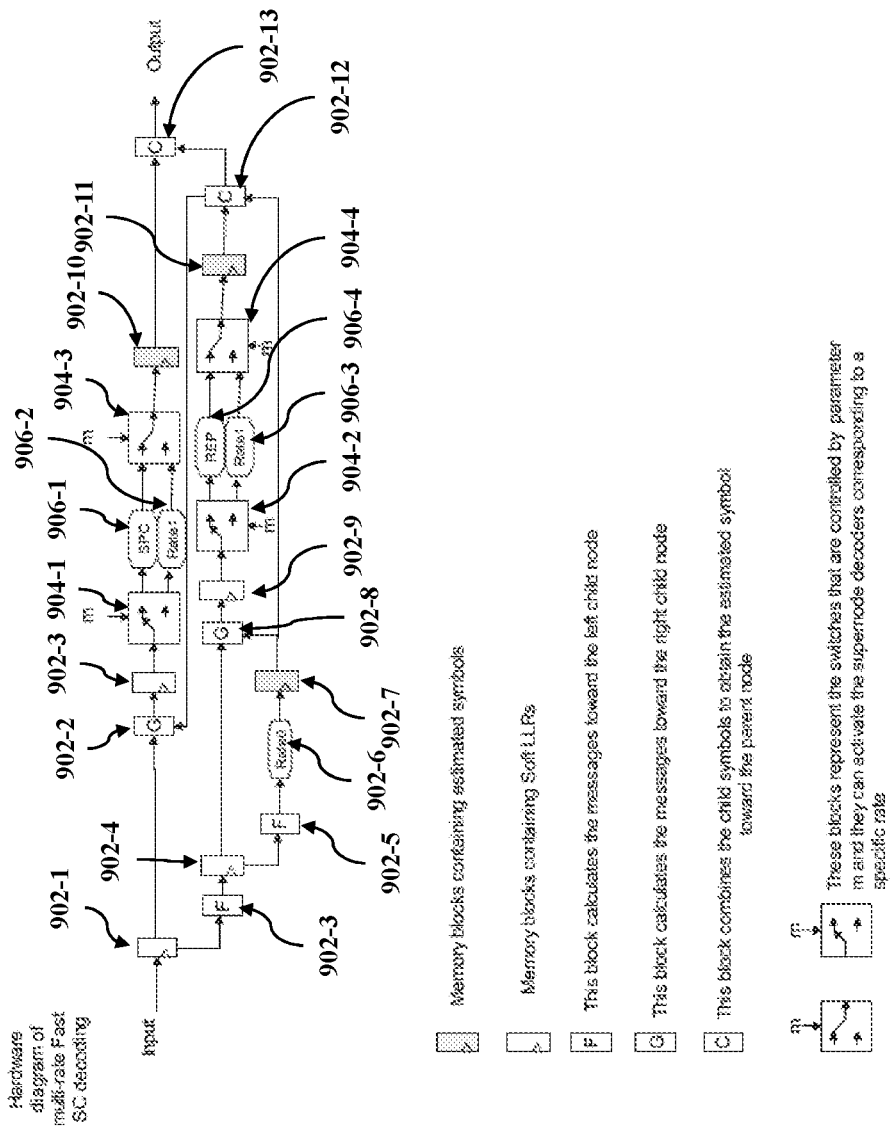
FIG. 9 is a schematic representation of a flexible-rate polar decoder for decoding binary data symbols using the unified binary tree of FIG. 7, in accordance with various embodiments of the present disclosure.

FIG. 9 is a schematic representation of a flexible-rate polar decoder 900 for decoding binary data symbols using the unified binary tree of FIG. 7, in accordance with various embodiments of the present disclosure. Specific purposes of computing blocks and memory blocks of the flexible-rate polar decoder 900 are described in FIG. 9. The blocks denoted "SPC", "REP", "Rate 1", and "Rate 0" in FIG. 8 are computing blocks that execute the decoding routines for SPC nodes, REP nodes, Rate 1 nodes, and Rate 0 nodes respectively.

As can be seen in FIG. 9 the number of memory units and computing units is drastically reduced in the flexible-rate polar decoder 900, which provides reduced footprint, faster computing calculations, and cheaper implementation to decode the received encoded binary data symbols. Broadly speaking, the present disclosure may thus lower latency of decoding processes in real applications such as Fiber optical communications and 5G.

In some embodiments, the flexible-rate polar decoder 900 may be a part of a Digital Signal Processor (DSP) chip of an encoding/decoding system or any electronic device used for encoding and/or decoding binary symbols. In the same or other embodiments, the flexible-rate polar decoder 900 may be a part of a forward error correction code (FEC) block of the encoding/decoding system or the electronic device.

The flexible-rate polar decoder 900 may be divided into a first portion and a second portion. The first portion may include at least some implemented nodes of the unified binary tree 710 that are common to all of the binary trees 706 and 708, the first portion may be shared among polar codes having different rates. By way of example, the memory block components, such as, 902-1, 902-3, 902-4, 902-7, 902-9, 902-10, 902-11, 902-12, and 902-13 configured to contain estimated symbols and/or soft LLRs and processing components, such as, 902-2, 902-5, 902-6, and 902-8 may be included in the first portion.

The second portion may include one or more switches, such as, 904-1, 904-2, 904-3, and 904-4 and super nodes 906-1, 906-2, 906-3, and 906-4 located at super locations. The super nodes 906-1, and 906-2 may be located at a first super location and the super nodes 906-3 and 906-4 may be located at a second super location. The second portion may be separated from the first portions by one or more switches 904-1, 904-2, 904-3, and 904-4.

In various non-limiting embodiments, the flexible-rate polar decoder 900 may be coupled to the controller 602. The controller 602 may be configured to receive polar codes based encoded data and may determine a rate at which the data is encoded. Based on the determined rate, the controller 602 may be configured to generate control signals for the one or more switches 904-1, 904-2, 904-3, and 904-4 to select suitable implemented super nodes. By way of example, when the required OH is 28% and the associated super nodes at the super locations are SPC and REP, the controller 602 may generate control signals for the switches 904-1, 904-2, 904-3, and 904-4 to select appropriate super nodes.

It may be observed from the representative flexible-rate polar decoder 900 the required memories at various levels of the binary tree for all the OHs may be shared. Thereby, reducing the actual hardware requirement to implement the flexible-rate polar decoder 900. Additionally, the flexible-rate polar decoder 900 may achieve minimal latency for a multi-rate decoder. It is to be noted that in polar decoders, the power consumption is proportional to the latency of the decoder in high-throughput scenarios. Therefore, reducing the latency would significantly reduce the power consumption and chip area.

Figure 10:
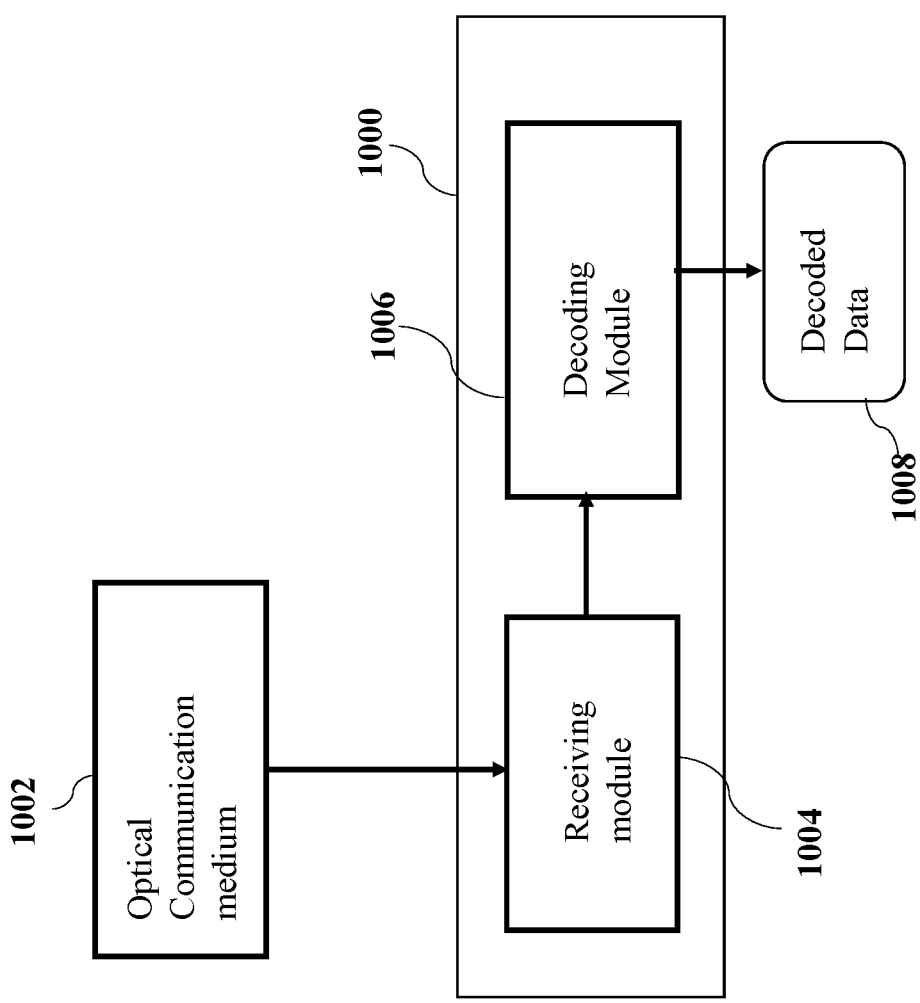
FIG. 10 is a block diagram illustrating a system configured to receive and decode encoded binary data symbols, in accordance with various embodiments of the present disclosure.

FIG. 10 is a block diagram illustrating a system 1000 configured to receive and decode encoded binary data symbols, in accordance with various embodiments of the present disclosure. The system 1000 is communicably connected to a communication medium 1002 for receiving the encoded binary data symbols therefrom, and includes a receiving module 1004 and a decoding module 1006 for outputting decoded data 1008. However, it should be understood that in some embodiments of the present disclosure, the system 1000 may be implemented with additional, fewer, and/or different components to those illustrated in FIG. 10. For example, the system 1000 may be embodied as an optical communication system (e.g., optical transceiver) enabling communication of moderate-rate large-length codes over the communication medium 1002 or another optical communication medium. In a non-limiting embodiment, the communication medium 1002 is an optical communication medium such as an optical fiber. It is contemplated that the receiving module 1004 may support optical termination and conversion of signals between electrical and optical domains, to provide for reception of encoded binary data symbols over the optical communication medium 1002. For example, and without limitation, the decoding module 1006 may be implemented as the flexible-rate polar decoder 900.

A structure and operation of each of these modules may depend on inter alia physical media and signaling mechanisms or protocols of components of the system 1000 by which they are executed. In general, each component includes at least some sort of physical connection to a transfer medium, possibly in combination with other hardware and/or software-based elements, which will depend on inter alia a specific transfer media and/or specific mechanisms and/or specific implementations of the present technology.

Figure 11:
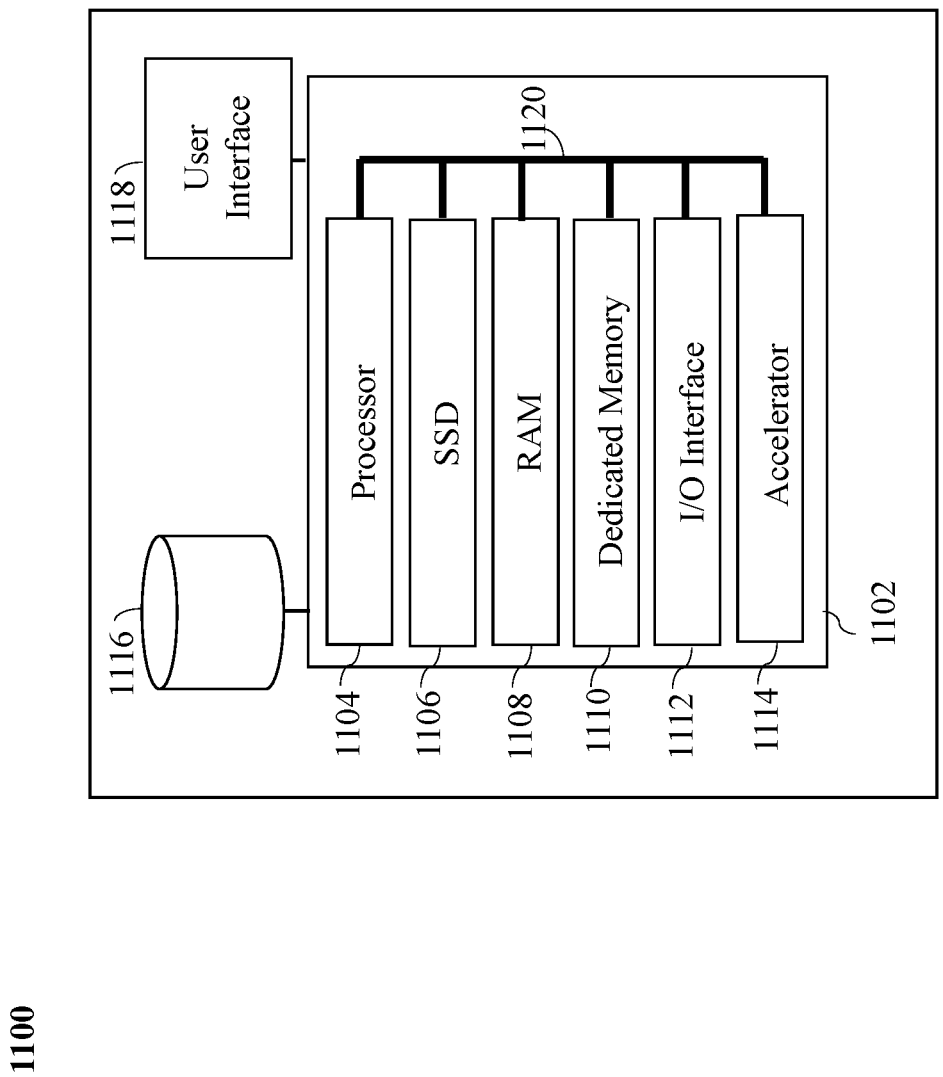
FIG. 11 is a block diagram of a controller, in accordance with some non-limiting embodiments of the present disclosure.

With reference to FIG. 11, there is shown a controller 1100 in accordance with non-limiting implementations of the present technology. In an embodiment, the system 1000 is implemented as the controller 1100, the controller 1100 being suitable for executing all functions of the system 1000, including the functions of the receiving module 1004 and of the decoding module 1006.

The controller 1100 comprises a computing unit 1102. In some implementations, the computing unit 1102 may be implemented by any of a conventional personal computer, a controller, and/or an electronic device (e.g., a server, a controller unit, a control device, a monitoring device etc.) and/or any combination thereof appropriate to the relevant task at hand. In some embodiments, the computing unit 1102 comprises various hardware components including one or more single or multi-core processors collectively represented by a processor 1104, a solid-state drive 1106, a RAM 1108, a dedicated memory 1110 and an input/output interface 1112. The computing unit 1102 may be a generic computer system.

In some other embodiments, the computing unit 1102 may be an "off the shelf" generic computer system complemented by the addition of the flexible-rate polar decoder 900. In some embodiments, the computing unit 1102 may also be distributed amongst multiple systems. The computing unit 1102 may also be specifically dedicated to the implementation of the present technology. As a person in the art of the present technology may appreciate, multiple variations as to how the computing unit 1102 is implemented may be envisioned without departing from the scope of the present technology.

Communication between the various components of the computing unit 1102 may be enabled by one or more internal and/or external buses 1120 (e.g. a PCI bus, universal serial bus, IEEE 1394 "Firewire" bus, SCSI bus, Serial-ATA bus, ARINC bus, etc.), to which the various hardware components are electronically coupled.

The input/output interface 1112 may provide networking capabilities such as wired or wireless access. As an example, the input/output interface 1112 may comprise a networking interface such as, but not limited to, one or more network ports, one or more network sockets, one or more network interface controllers and the like. Multiple examples of how the networking interface may be implemented will become apparent to the person skilled in the art of the present technology. For example, but without being limitative, the networking interface may implement specific physical layer and data link layer standard such as Ethernet, Fibre Channel, Wi-Fi or Token Ring. The specific physical layer and the data link layer may provide a base for a full network protocol stack, allowing communication among small groups of computers on the same local area network (LAN) and large-scale network communications through routable protocols, such as Internet Protocol (IP).

According to implementations of the present technology, the solid-state drive 1106 stores program instructions suitable for being loaded into the RAM 1108 and executed by the processor 1104. Although illustrated as a solid-state drive 1106, any type of memory may be used in place of the solid-state drive 1106, such as a hard disk, optical disk, and/or removable storage media.

The processor 1104 may be a general-purpose processor, such as a central processing unit (CPU) or a processor dedicated to a specific purpose, such as a digital signal processor (DSP). In some embodiments, the processor 1104 may also rely on an accelerator 1114 dedicated to certain given tasks. In some embodiments, the processor 1104 or the accelerator 1114 may be implemented as one or more field programmable gate arrays (FPGAs). Moreover, explicit use of the term "processor", should not be construed to refer exclusively to hardware capable of executing software, and may implicitly include, without limitation, application specific integrated circuit (ASIC), read-only memory (ROM) for storing software, RAM, and non-volatile storage. Other hardware, conventional and/or custom, may also be included.

Further, the controller 1100 may include a Human-Machine Interface (HMI) 106. The HMI 106 may include a screen or a display capable of rendering an interface and indications of coded and/or decoded data, and/or any other information suitable for performing the routines and techniques described herein. In this embodiment, the display of the HMI 106 includes and/or be housed with a touchscreen to permit users to input data via some combination of virtual keyboards, icons, menus, or other Graphical User Interfaces (GUIs). The HMI 106 may thus be referred to as a user interface 1118. In some embodiments, the display of the user interface 1118 may be implemented using a Liquid Crystal Display (LCD) display or a Light Emitting Diode (LED) display, such as an Organic LED (OLED) display. The device may be, for example and without being limitative, a handheld computer, a personal digital assistant, a cellular phone, a network device, a smartphone, a navigation device, an e-mail device, a game console, or a combination of two or more of these data processing devices or other data processing devices. The user interface 1118 may be embedded in the controller 1100 as in the illustrated embodiment of FIG. 14 or located in an external physical location accessible to the user. For example, the user may communicate with the computing unit 1102 (i.e., send instructions thereto and receive information therefrom) by using the user interface 1118 wirelessly connected to the computing unit 1102. The computing unit 1102 may communicate with the user interface 1118 via a network (not shown) such as a Local Area Network (LAN) and/or a wireless connexion such as a Wireless Local Area Network (WLAN).

The controller 1100 may comprise a memory 1116 communicably connected to the computing unit 1102 for storing received coded data and/or generated decoded data. The memory 1116 may be embedded in the controller 1100 as in the illustrated embodiment of FIG. 14 or located in an external physical location. The computing unit 1102 may be configured to access a content of the memory 1116 via a network (not shown) such as a Local Area Network (LAN) and/or a wireless connexion such as a Wireless Local Area Network (WLAN).

Needless to say, the computing unit 1102 may be implemented in any other suitable hardware, software, and/or firmware, or a combination thereof. In the depicted non-limiting embodiments of the present technology in FIG. 14, the computing unit 1102 is a single component. In alternative non-limiting embodiments of the present technology, the functionality of the computing unit 1102 may be distributed and may be implemented via multiple components.

Those skilled in the art will appreciate that processor 1104 is generally representative of a processing capability that may be provided by, for example, a Central Processing Unit (CPU). In some embodiments, in place of or in addition to one or more conventional CPUs, one or more specialized processing cores may be provided. For example, one or more Graphic Processing Units (GPUs), Tensor Processing Units (TPUs), accelerated processors (or processing accelerators) and/or any other processing unit suitable for executing decoding protocols may be provided in addition to or in place of one or more CPUs. In alternative embodiments, the dedicated memory 1108 may be a Random Access Memory (RAM), a Video Random Access Memory (VRAM), a Window Random Access Memory (WRAM), a Multibank Dynamic Random Access Memory (MDRAM), a Double Data Rate (DDR) memory, a Graphics Double Data Rate (GDDR) memory, a High Bandwidth Memory (HBM), a Fast-Cycle Random-Access Memory (FCRAM) or any other suitable type of computer memory.

While the above-described implementations have been described and shown with reference to particular operations performed in a particular order, it will be understood that these operations may be combined, sub-divided, or re-ordered without departing from the teachings of the present technology. At least some of the operations may be executed in parallel or in series. Accordingly, the order and grouping of the operations is not a limitation of the present technology.

Those of ordinary skill in the art will realize that the descriptions of various embodiments are illustrative only and are not intended to be in any way limiting. Other embodiments will readily suggest themselves to such persons with ordinary skill in the art having the benefit of the present disclosure. Furthermore, at least some of the disclosed embodiments may be customized to offer valuable solutions to existing needs and problems related to FEC solutions. In the interest of clarity, not all of the routine features of the implementations of the at least some of the disclosed embodiments are shown and described.

In particular, combinations of features are not limited to those presented in the foregoing description as combinations of elements listed in the appended claims form an integral part of the present disclosure. It will, of course, be appreciated that in the development of any such actual implementation of the at least some of the disclosed embodiments, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of digital error correction having the benefit of the present disclosure.

In accordance with the present disclosure, the components, process operations, and/or data structures described in herein may be implemented using various types of operating systems, computing platforms, network devices, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used. Where a routine including a series of operations is implemented by a computer, a processor operatively connected to a memory, or a machine, those operations may be stored as a series of instructions readable by the machine, processor or computer, and may be stored on a non-transitory, tangible medium.

Systems and modules described herein may comprise software, firmware, hardware, or any combination(s) of software, firmware, or hardware suitable for the purposes described herein. Software and other modules may be executed by a processor and reside on a memory of servers, workstations, personal computers, computerized tablets, personal digital assistants (PDA), and other devices suitable for the purposes described herein. Software and other modules may be accessible via local memory, via a network, via a browser or other application or via other means suitable for the purposes described herein. Data structures described herein may comprise computer files, variables, programming arrays, programming structures, or any electronic information storage schemes, routine and techniques, or any combinations thereof, suitable for the purposes described herein.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifi-

What is claimed is:

1. A method for creating a flexible-rate polar decoder for a communication system, the method comprising:
    receiving polar codes corresponding to a set of desired overheads;
    for each overhead of the set of desired overheads, generating a binary tree using fast successive cancellation decoding;
    generating a unified binary tree from the binary trees associated with the set of overheads, the generating of the unified binary tree comprising:
        within each binary tree, determining locations of super nodes;
        representing the determined locations having same node index among different binary trees as super locations in the unified binary tree, in which each super location includes more than one super node; and;
    implementing the unified binary tree on an application specific hardware structure to create the flexible-rate polar decoder.

2. The method of claim 1 wherein the super nodes include one or more of Rate-0, Rate-1, repetition (REP), single parity check (SPC), TypeI, TypeII, TypeIII, TypeV, TypeV super nodes.

3. The method of claim 1, wherein the application specific hardware corresponding to the flexible-rate polar decoder includes:
    a first portion that includes at least some implemented nodes of the unified binary tree that are common to all of the binary trees, the first portion is shared among polar codes having different rates; and
    a second portion that includes:
        implemented super nodes at the super locations, and
        one or more switches configured to select suitable implemented super nodes depending on a rate of the polar codes.

4. The method of claim 3, wherein the second portion is separated from the first portions by the one or more switches.

5. The method of claim 1, further comprising integrating the flexible-rate polar decoder in a receiver associated with the communication system.

6. A receiver in a communication system, comprising:
    a flexible-rate polar decoder comprising:
        a first portion including at least some implemented nodes of a unified binary tree that are common to all binary trees associated with the unified binary tree, the first portion is shared among polar codes having different rates; and
        a second portion including:
            implemented super nodes associated with the binary trees located at super locations, the super locations representing the locations having same node index among different binary trees; and
            one or more switches configured to select suitable implemented super nodes depending on a rate of the polar codes.

7. The receiver of claim 6, wherein the second portion is separated from the first portions by the one or more switches.

8. The receiver of claim 6, wherein the unified binary tree is previously generated and includes the binary trees corresponding to polar codes related to a set of desired overheads.

9. The receiver of claim 6, wherein the super locations include more than one super node.

10. The receiver of claim 6 further comprising a controller configured to:
    receive polar codes based encoded data;
    determine the rate at which the data is encoded; and
    based on the determined rate, provide control signals to the one or more switches to select suitable implemented super nodes.

11. The receiver of claim 6, wherein the super nodes include one or more of Rate-0, Rate-1, repetition (REP), single parity check (SPC), TypeI, TypeII, TypeIII, TypeIV, TypeV super nodes.

* * * * *